Figure 1:
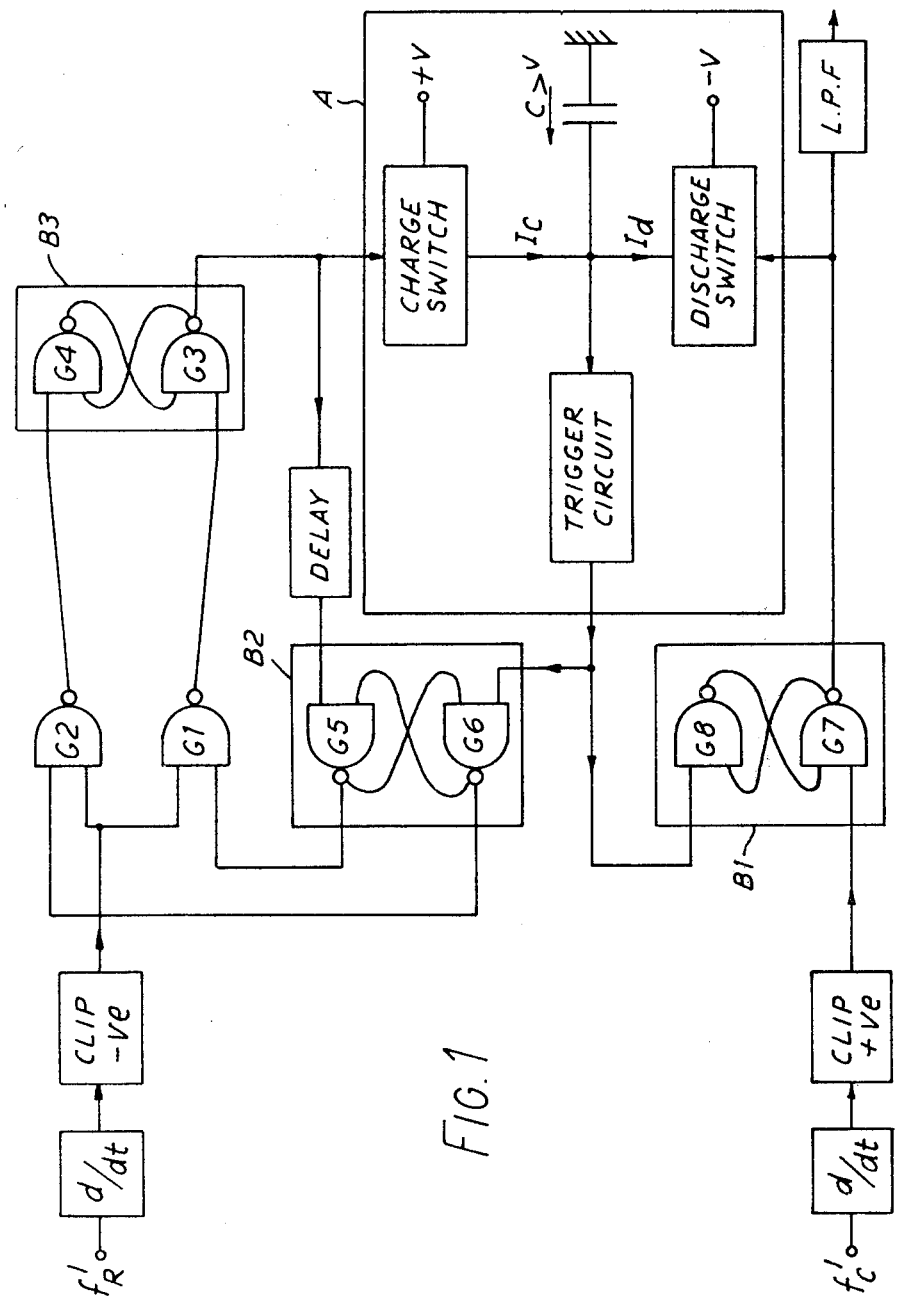

United States Patent [19]

Robson

[11] 4,359,691

[45] Nov. 16, 1982

[54] DEMODULATOR FOR FREQUENCY MODULATED SIGNAL ACCOMPANIED BY REFERENCE SIGNAL

[75] Inventor: Alan Robson, Wells, England

[73] Assignee: EMI Limited, Hayes, England

[21] Appl. No.: 201,236

[22] Filed: Oct. 27, 1980

[30] Foreign Application Priority Data

Oct. 26, 1979 [GB] United Kingdom ............. 7937263

[51] Int. Cl.³ .............................................. H03K 9/06
[52] U.S. Cl. ..................................... 329/50; 329/107; 375/82; 360/28
[58] Field of Search .......................... 329/50, 107, 110; 375/80, 82; 360/27–30

[56] References Cited

U.S. PATENT DOCUMENTS 3,433,903  3/1969  Murray et al. ......................... 360/28
4,031,479  6/1977  Thomas, Jr. et al. ................. 329/50

FOREIGN PATENT DOCUMENTS 1409715  10/1975  United Kingdom .

Primary Examiner—Siegfried H. Grimm
Attorney, Agent, or Firm—Fleit & Jacobson

[57] ABSTRACT

The demodulator is especially adapted for a data signal ($F'c$) that was recorded on tape in the form of a frequency modulated signal together with a reference signal ($F'R$) of frequency greater than the greatest frequency of the data signal, so that both signals are subject to the same proportional frequency errors. During each cycle of the data signal, a representation of the period of one cycle of the reference signal is measured and stored. Then at the end of each following cycle of the data signal, there is produced a pulse of area dependent on the representation. A filter (LPF) produces a signal representing the area of each pulse averaged over one cycle of the data signal.

8 Claims, 5 Drawing Figures

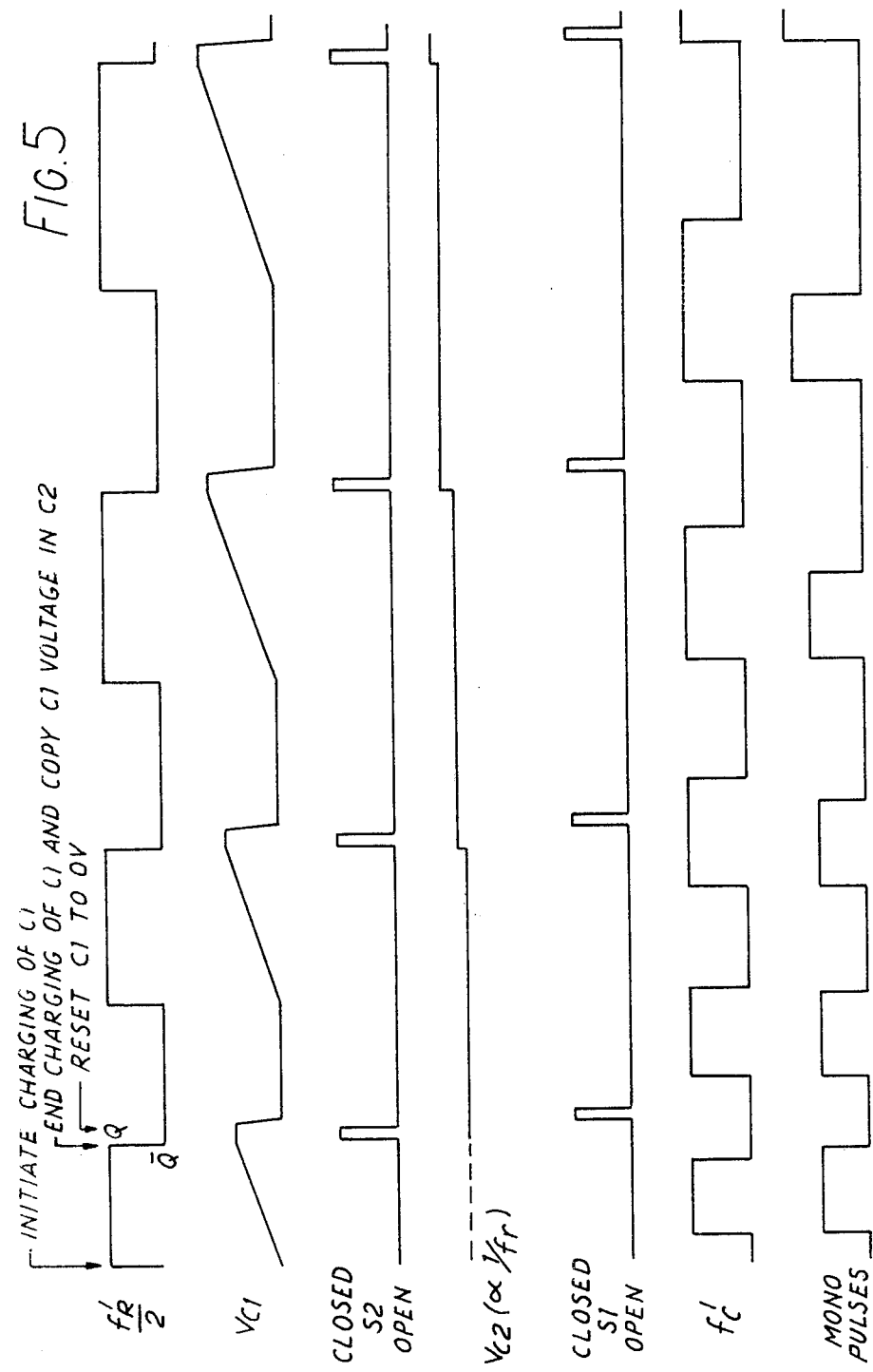

DEMODULATOR FOR FREQUENCY MODULATED SIGNAL ACCOMPANIED BY REFERENCE SIGNAL

The present invention relates to a frequency demodulator.

One method of recording data is to record it as a frequency modulation of a carrier signal. This method is used in, for example, instrumentation magnetic tape recording. Any random fluctuations in the tape speed, called flutter, cause unpredictable variations in the frequencies of the recorded modulated signal and thus errors in reproducing the data.

Various techniques of flutter compensation have been proposed. In one proposal, described in British Patent 1409715 (Lucas Industries Ltd.), a reference carrier of frequency fR is recorded in one channel of a tape and the modulated carrier fc in another channel. On replay the signals are fed to means for determining the ratio of the frequency of the modulated signal to the frequency of the reference signal. When flutter occurs the signals fR and fc are modulated by the same factor a to produce replay signals f'R=afR and f'c=afc.

By forming the ratio afc/afR=fc/fR, where fR is constant, a signal linearly proportional to fc is obtained.

It is an object of the present invention to provide a frequency demodulator for demodulating a frequency modulated signal accompanied by a reference signal which signals are subject to the same frequency errors, the demodulator being arranged to compensate for the errors.

According to the invention, there is provided a frequency demodulator for demodulating a frequency modulated signal derived from a source where it is accompanied by a reference signal of frequency greater than the greatest frequency of the modulated signal, the modulated and reference signals being subject to the same proportional frequency errors, the demodulator comprising
an input for receiving the modulated signal,
an input for receiving the reference signal,
means arranged to measure and store, during each cycle of the modulated signal, a representation of the period of one cycle of the reference signal occurring during that cycle of the modulated signal,
means responsive to the modulated signal to produce a pulse of area dependent on the stored representation during a predetermined portion of the cycle of the modulated signal following the one in which the representation was stored, and
filter means for producing a signal representing the area of each pulse averaged over one cycle of the modulated signal.

Figure 2:
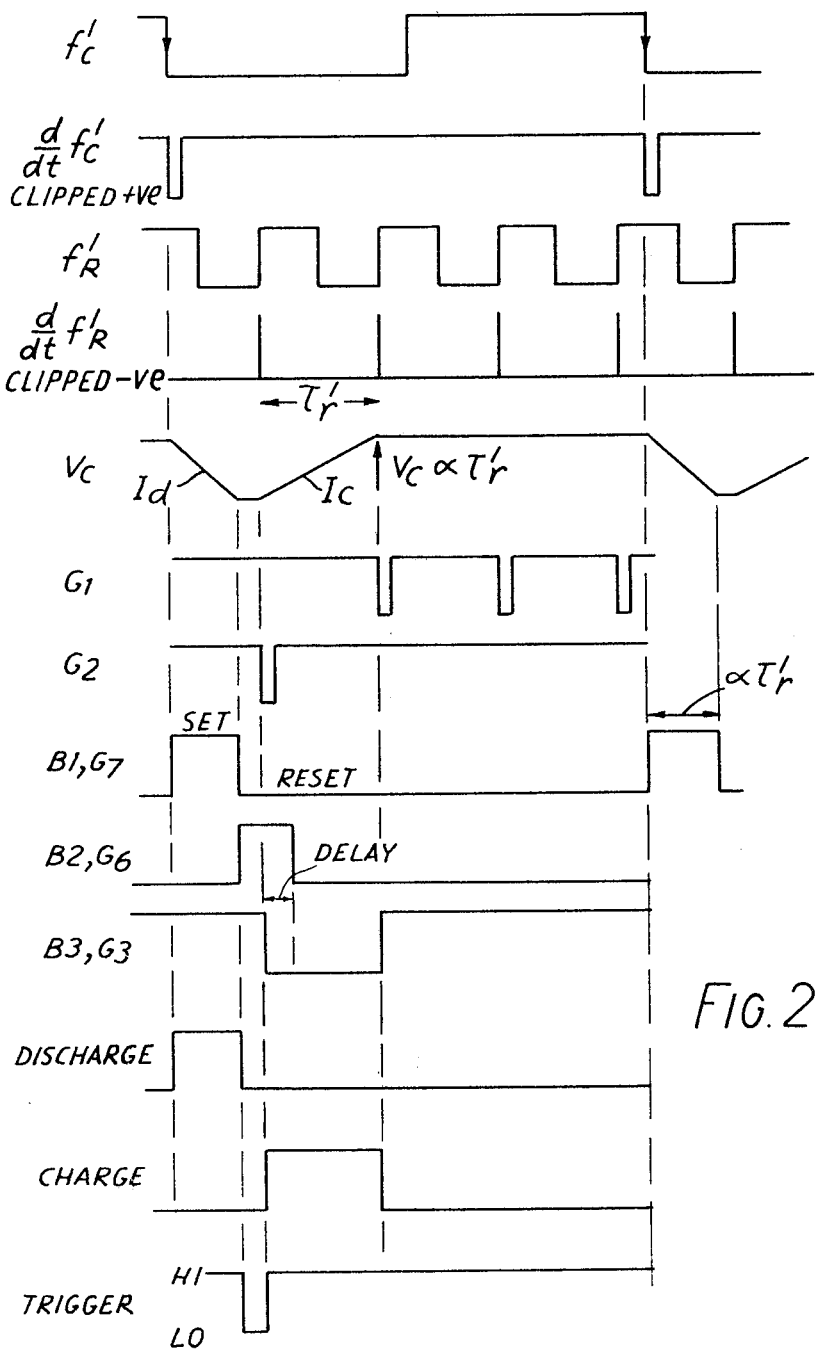
Figure 3:
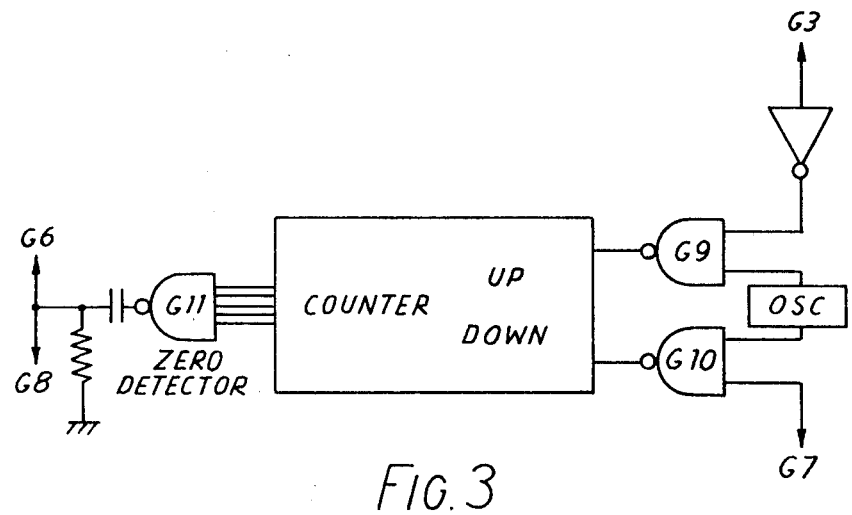
Figure 4:
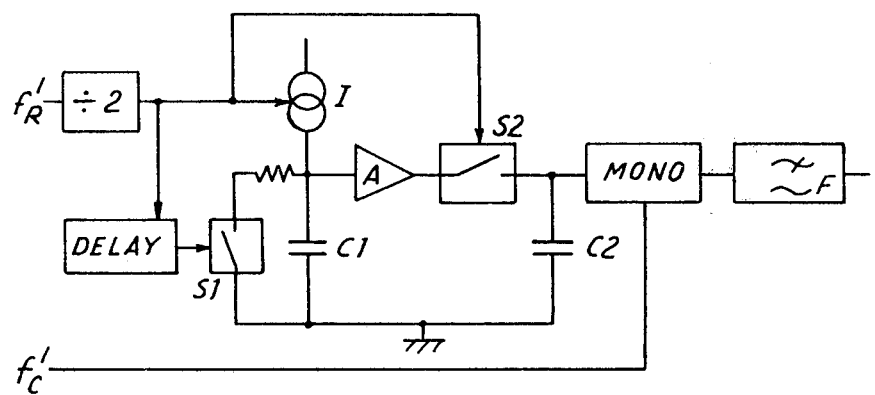

For a better understanding of the invention, and to show how the same may be carried into effect, reference will now be made, by way of example to the accompanying drawings in which:

FIG. 1 is a block diagram of one embodiment of the frequency demodulator of the invention, FIG. 2 is an idealised signal-amplitude-time diagram explaining the operation of the demodulator of FIG. 1, FIG. 3 is a block diagram of a circuit for use in place of the block designated A in FIG. 1, FIG. 4 is a block diagram of another embodiment of the frequency demodulator of the invention, and, FIG. 5 is an idealised signal-amplitude-time diagram explaining the operation of the demodulator of FIG. 4.

Assume a carrier signal is frequency modulated with data and recorded on a magnetic tape record which is subject to tape speed variations, which are referred to as 'flutter'. On replay of the recorded modulated signal the flutter will cause frequency shifts which may cause errors in the reproduction of the data.

If the modulated signal is represented by fc and flutter f(t) affects it then on replay a signal f'c=(1+f(t))fc is produced.

If a reference signal fR of constant frequency is also recorded on the tape simultaneously with fc, either in a separate track, or superimposed on fc it will be subject to the same flutter to give on replay f'R=(1+f(t)) fR.

By forming the ratio (f'c)/(f'R)=(fc)/(fR) a function linearly proportional to fc (i.e. not subject to flutter) is obtained. (Time expansion or contraction, however, is not corrected).

The principle of the present invention is to form during each cycle of f'c a pulse whose area A is proportional to the period $\tau$ of one cycle of the signal f'R occurring during that cycle of f'c i.e. $A=[(K_1 a_1)/(f'R)]$, $A=K_1 a \tau' R$ where $K_1$ and a are constants.

Thus a pulse of area A is produced once per cycle of f'c producing a pulse train whose average value over one cycle $\tau'c$ of f'c is $=(A/\tau'c)=K_1 a[(\tau'R)/(\tau'c)]=K_1 a[(f'c)/(f'R)]=K_1 a(fc/fR)$.

Thus the average value is linearly proportional to fc.

Because there is no fixed phase relationship between f'R and f'c, the pulse produced during each cycle of f'c will vary in position relative to the beginning of each cycle of f'c from cycle to cycle. This produces a variation in pulse spacing which produces an undesired modulation of the average value. Thus in the examples of the present invention shown in the Figures, a representation of $\tau'R$ is produced and stored during each cycle of f'c and then a pulse of area proportional to $\tau'_R$ is produced from the representation precisely at the beginning of the next cycle of f'c. Thus, the pulses are produced regularly avoiding the undesired modulation of the average value. It will be appreciated that the pulses could be produced at any predetermined portion of the cycles of f'c.

The frequency demodulator of FIGS. 1 and 2 will now be described. Referring now to FIGS. 1 and 2 the reference signal f'R and the modulated signal f'c which are square waves, are derived from, for example, separate tracks of a magnetic tape in known manner and applied to respective inputs. Each signal is differentiated in a differentiator d/dt to derive pulses indicating the pulse edges.

The positive going pulses of the output of the differentiator for f'c are removed by a clipping circuit clip+ve to produce the pulse train d/dt f'c shown in FIG. 2 where negative going pulses mark the boundaries of each cycle of f'c. The negative going pulses of the differentiator of f'R are removed in corresponding manner by a clipping circuit clip−ve to produce the pulse train d/dt f'R shown in FIG. 2 where positive going pulses mark the boundaries of each cycle of f'R.

Assume that a capacitor C in FIG. 1 is initially charged to a voltage Vc and that the output of a gate G7 of a bistable circuit B1 is low i.e. the bistable is reset. A negative going pulse of d/dt f'c changes i.e. sets the state of the bistable B1 so the output of G7 goes high and thus activates a discharge switch which discharges the capacitor C at a fixed discharge rate Id until a trigger circuit detects that the voltage on the capacitor goes below threshold level, e.g. zero volts, and produces a low output which resets the bistable B1. At the same time, the trigger circuit sets a bistable B2 comprising gates G5 and G6, causing the output of G6 to go high and the output of G5 to go low. This in turn enables a gate G2 and disables a gate G1.

The positive going pulse of d/dt f'R immediately following the aforementioned negative going pulse of d/dt f'c is then passed (inverted) to a gate G4 of a bistable B3 which changes the state of B3 so that the output of a gate G3, which was previously high, goes low. A charging switch responds to the low output of gate G3 to charge the capacitor C at a fixed charging rate Ic, which may be, but is not necessarily, equal to the discharge rate Id.

The transition of the output of the gate G3 from high to low causes, after a delay, the state of the bistable B2 to revert to the output of gate G6 being low. This then enables gate G1 but disables gate G2. Now that gate G1 is enabled, the next positive going pulse of d/dt f'R is passed by it (inverted) to bistable B3 so that the output of gate G3 goes high again stopping the charging of the capacitor C. The capacitor C is then charged to a voltage Vc, proportional to the period of one cycle of f'R.

During the charging of the capacitor C the output of the trigger circuit goes high again, but this alone has no effect on the state of the bistable B2. Furthermore, when bistable B3 reverts to the state in which the output of gate G3 is high at the end of charging, bistable B2 still retains the same state, in which G2 is disabled and thus its output is high and G1 enabled. B3 retains the state in which the output of G3 is high, irrespective of further pulses of d/dt f'R because G2 is disabled and both inputs to B3 must go low to change that state.

The next negative-going pulse of d/dt f'c sets B1 (output of G7 goes high) to discharge the capacitor C at the fixed discharging rate until the trigger circuit resets B1. Thus bistable B1 remains set for a time proportional to the voltage Vc on the capacitor and proportional to the period $\tau'R$.

The output of the bistable B1 is thus a pulse of area proportional to the period $\tau'R$ measured during one cycle of f'c and produced at the beginning of the next cycle.

The pulse train produced by the bistable B1 is fed to a filter L.P.F. to produce a mean level of voltage at the output thereof which is directly proportional to fc/fR. The filter filters out the carrier and reference components and backs off the D.C. offset of the pulse train to give zero output voltage for fc at centre frequency. In the foregoing example, it is essential that the frequency of f'R is at least twice that of the greatest frequency of f'c, because the circuit effectively uses f'R to sample f'c and if f'R is not at least twice as great as f'c the Shannon sampling theorem is violated and this results in errors and ambiguities.

In order to halve the frequency of f'R the following method may be adopted. Leave the constant current sources permanently on, and by means of four switches (FET's perhaps) pass the currents alternately to two capacitors. With suitable gating, simultaneous charging and discharging can occur, and if the output pulse width is restricted to one half of the period of f'R then the latter frequency need be only marginally higher than the highest frequency of f'c.

Instead of using the analogue circuit of block A of FIG. 1, the digital circuit of FIG. 3 may be used.

When the output of gate G7 of bistable B1 goes high in response to a negative-going edge of f'c a gate G10 is enabled and a counter counts down in response to pulses of a train of frequency e.g. $f_1$ produced by an oscillator OSC. When zero count is detected B1 is reset as before.

When the output of gate G3 of bistable B3 goes low in response to a negative going edge of f'R a gate G9 is enabled and the counter counts up in response to pulses of a train of frequency lower than $f_1$, e.g. $f_1/2$, until the next negative going edge of f'R causes the output of G3 to go high again.

Thus the counter replaces the capacitor C, the zero detector replaces the trigger, and the oscillator OSC and gates G9 and G10 replace the charging and discharging switches.

The oscillator frequency $f_1$ must be many times greater than f'c to achieve high accuracy and to keep beat components at a low level. This sets a practical limit to carrier frequency and hence tape speed. In order to overcome, or at least diminish this restraint, it may be possible to start the oscillator at a precise instant rather than simply to gate out pulses from a continuously running oscillator.

The other embodiment of the frequency demodulator will now be described with reference to FIGS. 4 and 5.

The reference signal f'R is applied to a bistable ($\div 2$) to produce a signal of half the frequency of f'R and with the same duty cycle as f'R, which alternates between states Q and $\overline{Q}$ of the bistable as shown in FIG. 5. When the bistable is in state Q, a current source I is activated to charge a capacitor C1 at a fixed rate developing a voltage Vc1 across C1. When the bistable is in state $\overline{Q}$, the current source is deactivated. The transition between Q and $\overline{Q}$ makes a switch S2 conductive for a short time to charge a capacitor C2 to Vc2 via a buffer amplifier A and also makes a switch S1 conductive for a short time after S2 to discharge C1. A monostable MONO connects the capacitor C2 to an output filter F for a preset time in response to each positive going edge of the signal f'c.

FIG. 5 shows the effect of falling tape speed whilst playing back. $f'_c$ and $f'_R$ diminish together. $Vc_2$ increases and so the area of the MONO pulses increases, in the example shown, the width of the pulses being constant and the height increasing.

As with the embodiment of FIG. 1, the period of one cycle of f'R is measured and a representation of it stored during each cycle of f'c, and a pulse of area proportional to the period of f'R is produced at the beginning of the next cycle of f'c.

What we claim is:

1. A frequency demodulator for demodulating a frequency modulated signal derived from a source where it is accompanied by a reference signal of frequency greater than the greatest frequency of the modulated signal, the modulated and reference signals being subject to the same proportional frequency errors,
   the demodulator comprising
   an input for receiving the modulated signal,
   an input for receiving the reference signal,
   means arranged to measure and store, during each cycle of the modulated signal, a representation of the period of one cycle of the reference signal occurring during that cycle of the modulated signal,
   means responsive to the modulated signal to produce a pulse of area dependent on the stored representation during a predetermined portion of the cycle of the modulated signal following the one in which the representation was stored, and filter means for producing a signal representing the area of each pulse averaged over one cycle of the modulated signal.

2. A demodulator according to claim 1 which comprises, a storage device for storing a value, first means for varying the stored value at a first rate in a first sense, second means for varying the stored value at a second rate in a second sense, means for indicating the presence of a predetermined reference value stored in the storage device, means connected to the said input for receiving the reference signal and responsive to the reference signal and to the indicating means during a cycle of the modulated signal to produce a control signal which causes the first means to vary the stored value from the reference value at the first rate in the first sense for one period of the reference signal, means connected to the said input for receiving the modulated signal and responsive to the successive cycle of the modulated signal and to the indicating means to produce a control pulse of predetermined amplitude and of such duration as to cause the second means to vary the said value of the second rate in the second sense to return the stored value to the reference value, and the said filter means which is connected to receive the said control pulse to produce the said signal representing the area.

3. A demodulator according to claim 2, wherein the storage device comprises a capacitor, and the first and second means comprise respective means for varying the charge on the capacitor, and the indicating means comprises a circuit for indicating the presence of a preset charge on the capacitor.

4. A demodulator according to claim 2, wherein the storage device comprises a digital counter, and the first and second means comprise means for incrementing and decrementing the count in the counter and the indicating means indicates the presence of a preset count in the counter.

5. A demodulator according to claim 1, comprising a first storage device for storing a value, means responsive to each cycle of the reference signal to vary the value stored in the first storage device from a reference value at a first rate for the period of that cycle, a second storage device, means responsive to the end of the said cycle of the reference signal to transfer the said value stored in the first storage device to the second storage device, means responsive after a delay to the end of the said cycle to return the value stored in the first storage device to the reference value, means responsive to each cycle of the modulated signal to produce a pulse of area dependent on the value stored in the second storage device, and the said filter means which is arranged to receive the said pulse.

6. A demodulator according to claim 5, wherein the said pulse has a preset duration and an amplitude dependent on the value stored in the second storage device.

7. A demodulator according to claim 5 or 6, wherein the first storage device comprises a capacitor, and the means responsive to the reference signal includes means for varying the charge on the capacitor at a first rate.

8. A demodulator according to claim 7, wherein the second storage device comprises a capacitor.

* * * * *